United States Patent
Chiang et al.

(10) Patent No.: US 9,379,179 B2
(45) Date of Patent: Jun. 28, 2016

(54) ULTRA HIGH VOLTAGE ELECTROSTATIC DISCHARGE PROTECTION DEVICE WITH CURRENT GAIN

(71) Applicant: TAIWAN SEMICONDUCTOR MANUFACTURING COMPANY, LTD., Hsinchu (TW)

(72) Inventors: Hsin-Chih Chiang, Hsinchu (TW); Tung-Yang Lin, New Taipei (TW); Ruey-Hsin Liu, Hsinchu (TW); Ming-Ta Lei, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/079,715

(22) Filed: Nov. 14, 2013

(65) Prior Publication Data

US 2015/0130032 A1   May 14, 2015

(51) Int. Cl.
*H01L 29/06* (2006.01)
*H01L 29/66* (2006.01)
*H01L 29/861* (2006.01)
*H01L 27/02* (2006.01)

(52) U.S. Cl.
CPC ........ *H01L 29/0619* (2013.01); *H01L 29/0623* (2013.01); *H01L 29/66121* (2013.01); *H01L 29/861* (2013.01); *H01L 27/0255* (2013.01)

(58) Field of Classification Search
CPC ............ H01L 27/0248; H01L 27/0292; H01L 29/0623; H01L 29/063; H01L 29/0634
USPC ........................................................ 257/657
See application file for complete search history.

(56) References Cited

U.S. PATENT DOCUMENTS

2002/0036326 A1\* 3/2002 DeJong et al. ................ 257/369
2002/0096722 A1\* 7/2002 Gossner .............. H01L 27/0259
257/355

OTHER PUBLICATIONS adjacent. (n.d.) American Heritage® Dictionary of the English Language, Fifth Edition. (2011). Retrieved Oct. 5, 2015 from http://www.thefreedictionary.com/adjacent.*

\* cited by examiner

*Primary Examiner* — Mohammad Islam
*Assistant Examiner* — Mikka Liu
(74) *Attorney, Agent, or Firm* — Hauptman Ham, LLP

(57) ABSTRACT

A semiconductor device configured to provide increased current gain comprises a semiconductor substrate having a first conductivity type. The device also comprises a first semiconductor region having a second conductivity type. The device further comprises a second semiconductor region in the first semiconductor region to having the first conductivity type. The device additionally comprises a third semiconductor region in the first semiconductor region having the second conductivity type. The device also comprises a fourth semiconductor region outside the first semiconductor region having the first conductivity type. The device further comprises a fifth semiconductor region outside the first semiconductor region adjacent the fourth semiconductor region and having the second conductivity type. The device additionally comprises a first electrode electrically connected to the third semiconductor region. The device further comprises a second electrode electrically connected to the fourth semiconductor region and to the fifth semiconductor region.

20 Claims, 7 Drawing Sheets

ULTRA HIGH VOLTAGE ELECTROSTATIC DISCHARGE PROTECTION DEVICE WITH CURRENT GAIN

BACKGROUND

Technological advances in semiconductor integrated circuit (IC) materials, design, processing, and manufacturing have enabled ever-shrinking IC devices, where each generation has smaller and more complex circuits than the previous generation. Some semiconductor circuits composed of devices such as electrostatic discharge (ESD) protection Diodes are often adapted for high voltage applications. Common ESD Diodes sometimes achieve some current gain in a cathode to anode positive bias operation for ultra high voltage applications.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Common ESD Diodes limit the ability to increase a current during a cathode to anode positive bias operation in ultra high voltage applications, because a P/N junction between one semiconductor region such as a drift region and the anode is biased. Current gain, therefore, is limited, because the ESD Diode is a bias device. Ultra high voltage applications are, for example, operations that supply ESD Diodes with voltages that are over 100 V. Common ESD Diodes limit the current gain at ultra high voltage greater than about 800 V.

Figure 1:
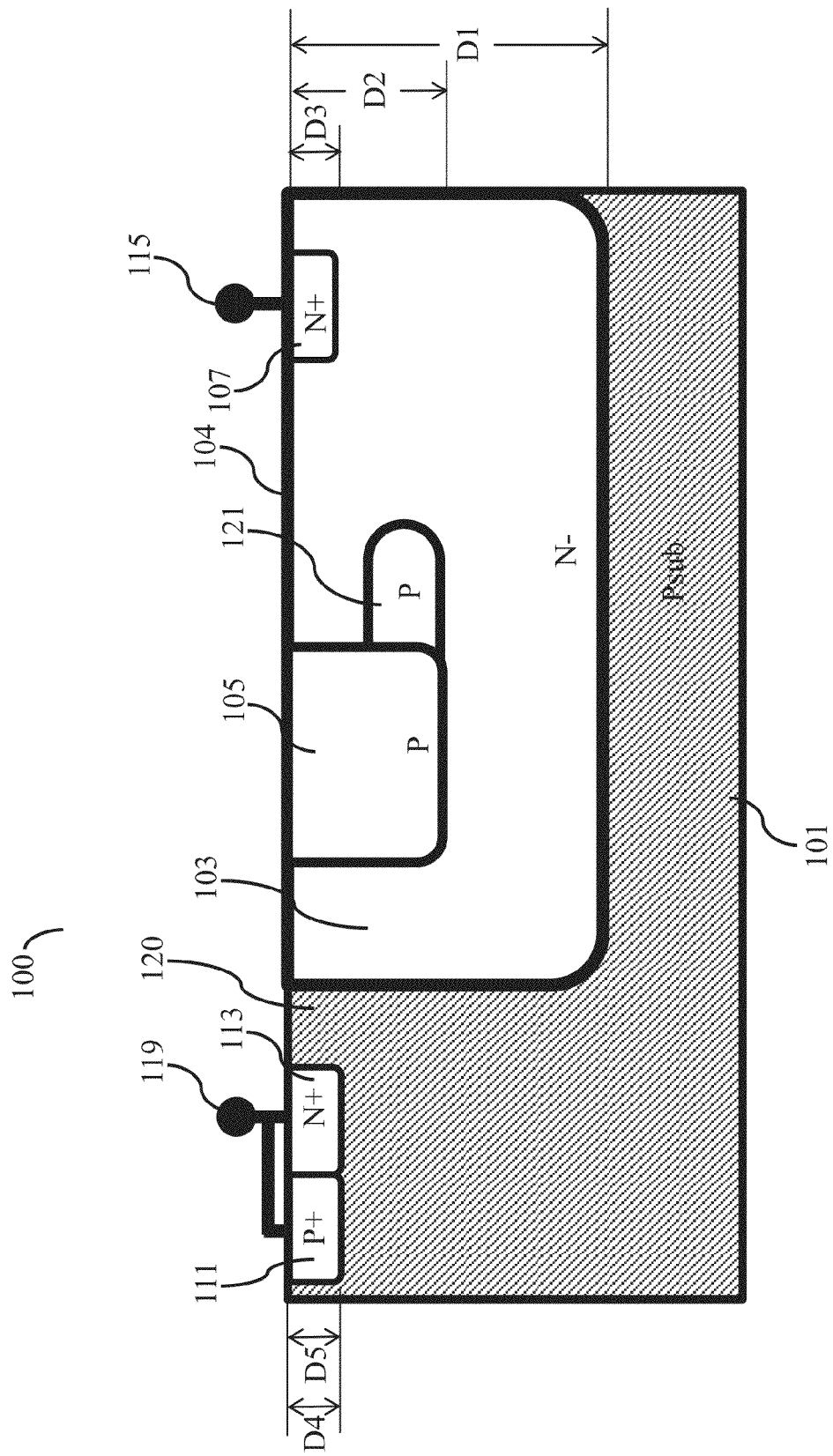
FIG. 1 is a diagram of a semiconductor device configured to make it possible to improve current gain during a cathode to anode positive bias operation in an ultra high voltage application, in accordance with one or more embodiments.

FIG. 1 is a diagram of a semiconductor device 100 configured to make it possible to improve current gain during a cathode to anode positive bias operation in an ultra high voltage application, in accordance with one or more embodiments. The semiconductor device 100 comprises a semiconductor substrate 101 having a first conductivity type that is P-type. The semiconductor device 100 also comprises a first semiconductor region 103 over a portion of the semiconductor substrate 101 having the first conductivity type to a first depth D1 relative to an upper surface 104 of the semiconductor device 100. The first semiconductor region 103 has a second conductivity type that is N-type. In some embodiments, the first semiconductor region 103 is an "N−" region.

A second semiconductor region 105 is in the first semiconductor region 103 to a second depth D2 less than the first depth D1 relative to the upper surface 104 of the semiconductor device 100. The second semiconductor region 105 has P-type conductivity. The semiconductor device 100 also comprises a third semiconductor region 107 in the first semiconductor region 103 to a third depth D3 less than the first depth D1 relative to the upper surface 104 of the semiconductor device 100. The third semiconductor region 107 has N-type conductivity. A fourth semiconductor region 111 is outside the first semiconductor region 103 to a fourth depth D4 relative to the upper surface 104 of the semiconductor device 100. The fourth semiconductor region 111 has P-type conductivity and is, e.g., a "P+" region.

The semiconductor device 100 additionally comprises a fifth semiconductor region 113 outside the first semiconductor region 103 to a fifth depth D5 relative to the upper surface 104 of the semiconductor device 100. The fifth semiconductor region 113 is adjacent the fourth semiconductor region, has N-type conductivity, and is, e.g., an "N+" region. In some embodiments, the fifth depth D5 is equal to the fourth depth D4. In other embodiments, the fifth depth D5 is greater than the fourth depth D4, or vice versa.

The semiconductor device 100 further comprises a first electrode 115 electrically connected to the third semiconductor region 107. The first electrode 115 is a cathode.

The semiconductor device 100 also comprises a second electrode 119 electrically connected to the fourth semiconductor region 111 and to the fifth semiconductor region 113. The second electrode 119 is an anode. The fifth semiconductor region 113 is configured to cause an increase in a current during a cathode to anode positive bias operation between the first electrode 115 and the second electrode 119 as a voltage supplied to the cathode, or the first electrode 115 increases in ultra high voltage applications.

For example, the P/N 120 junction between the semiconductor substrate 101 and the first semiconductor region 103 is affected by the fifth semiconductor region 113, because the "N+" region makes it possible to achieve a higher sustain current above a trigger voltage as the voltage supplied to the cathode, or the first electrode 115, increases to and above the trigger voltage. Similarly, the increase in voltage supplied to the cathode, or the first electrode 115, while maintaining an anode voltage at 0 V, for example, results in a negative resistance as the voltage supplied to the cathode, or the first electrode 115, increases to and above the trigger voltage. The negative resistance results in an increased current gain during the cathode to anode positive bias operation.

In one or more embodiments, the semiconductor device 100 optionally comprises a buried semiconductor region 121 in the first semiconductor region 103 adjacent the second semiconductor region 105. The buried semiconductor region 121 has, e.g., P-type conductivity. The second semiconductor region 105 and the buried semiconductor region 121 are together configured to be a reduced surface electric field (RESURF) structure. In some embodiments, the buried semiconductor region 121 has a same doping as the second semiconductor region 105. In other embodiments, the buried semiconductor region 121 has a different doping than the second semiconductor region 105.

In some embodiments, the semiconductor substrate 101 is a semiconductor substrate comprising silicon. Alternatively, the substrate 101 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or one or more other suitable materials.

In one or more embodiments, the first semiconductor region 103, the second semiconductor region 105, the third semiconductor region 107, the fourth semiconductor region 111, the fifth semiconductor regions 113, the buried semiconductor region 121, and/or any other semiconductor region are doped regions, as discussed above, such as P-type or N-type. The doped regions, in some embodiments, are doped with P-type dopants, such as boron, $BF_2$, or other suitable dopant, and N-type dopants, such as phosphorus, arsenic, or other suitable dopant; or a combination thereof.

In some embodiments, one or more of the first electrode 115 and/or the second electrode comprise a conductive material such as gold, aluminum, copper, or other suitable conductive material.

Figure 2:
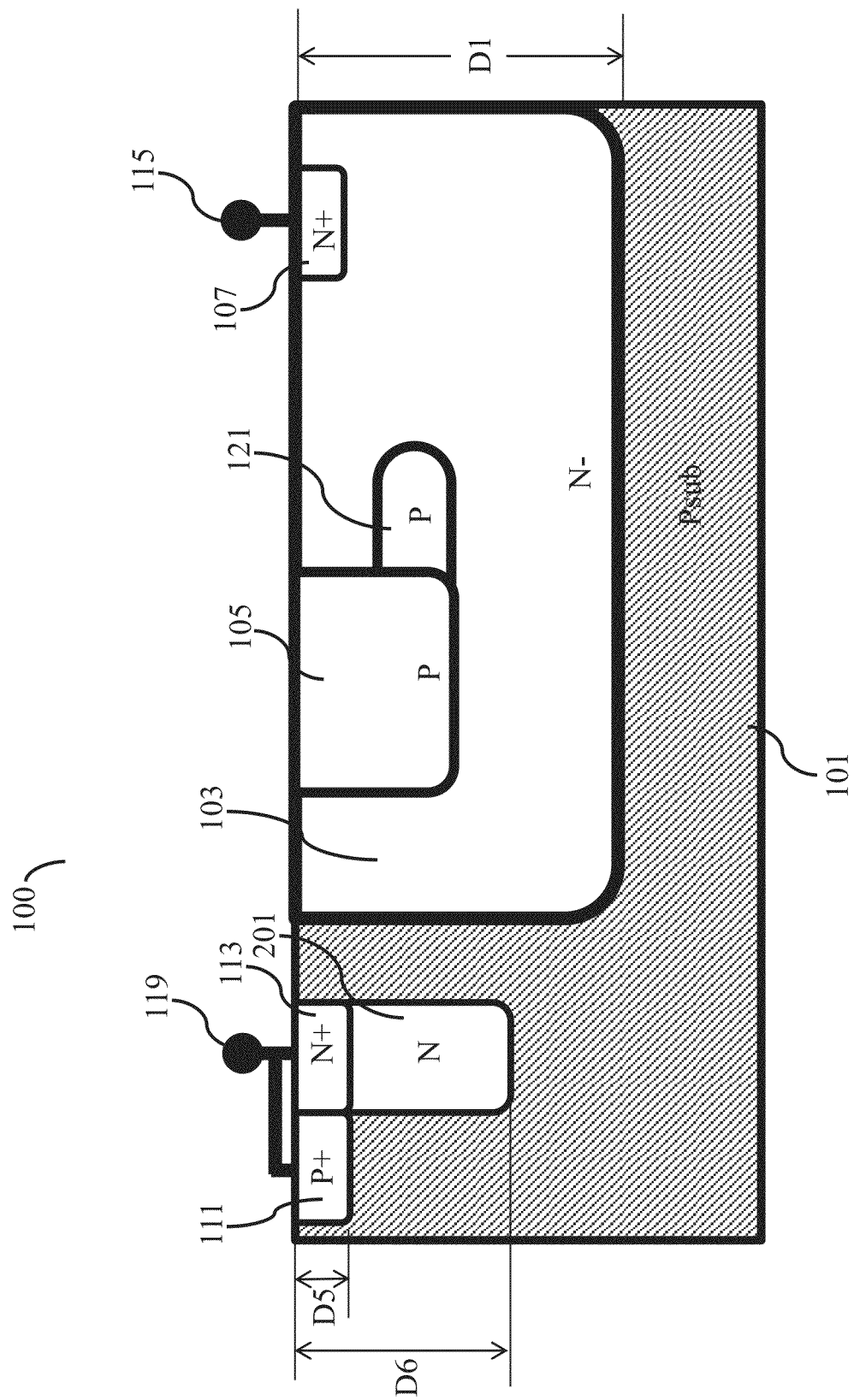
FIG. 2 is a diagram of the semiconductor device having an additional semiconductor region, in accordance with one or more embodiments.

FIG. 2 is a diagram of the semiconductor device 100 having an additional semiconductor region, in accordance with one or more embodiments.

In some embodiments, the semiconductor device 100 optionally comprises a sixth semiconductor region 201 below the fifth semiconductor region 113, in contact with the fifth semiconductor region 113, and to a sixth depth D6 relative to the upper surface 104 of the semiconductor device 100. The sixth semiconductor region 201 has N-type conductivity. In some embodiments, the sixth semiconductor region 201 is an "N" region. The sixth depth D6, in some embodiments, is greater than the fifth depth D5 and less than the first depth D1.

Figure 3:
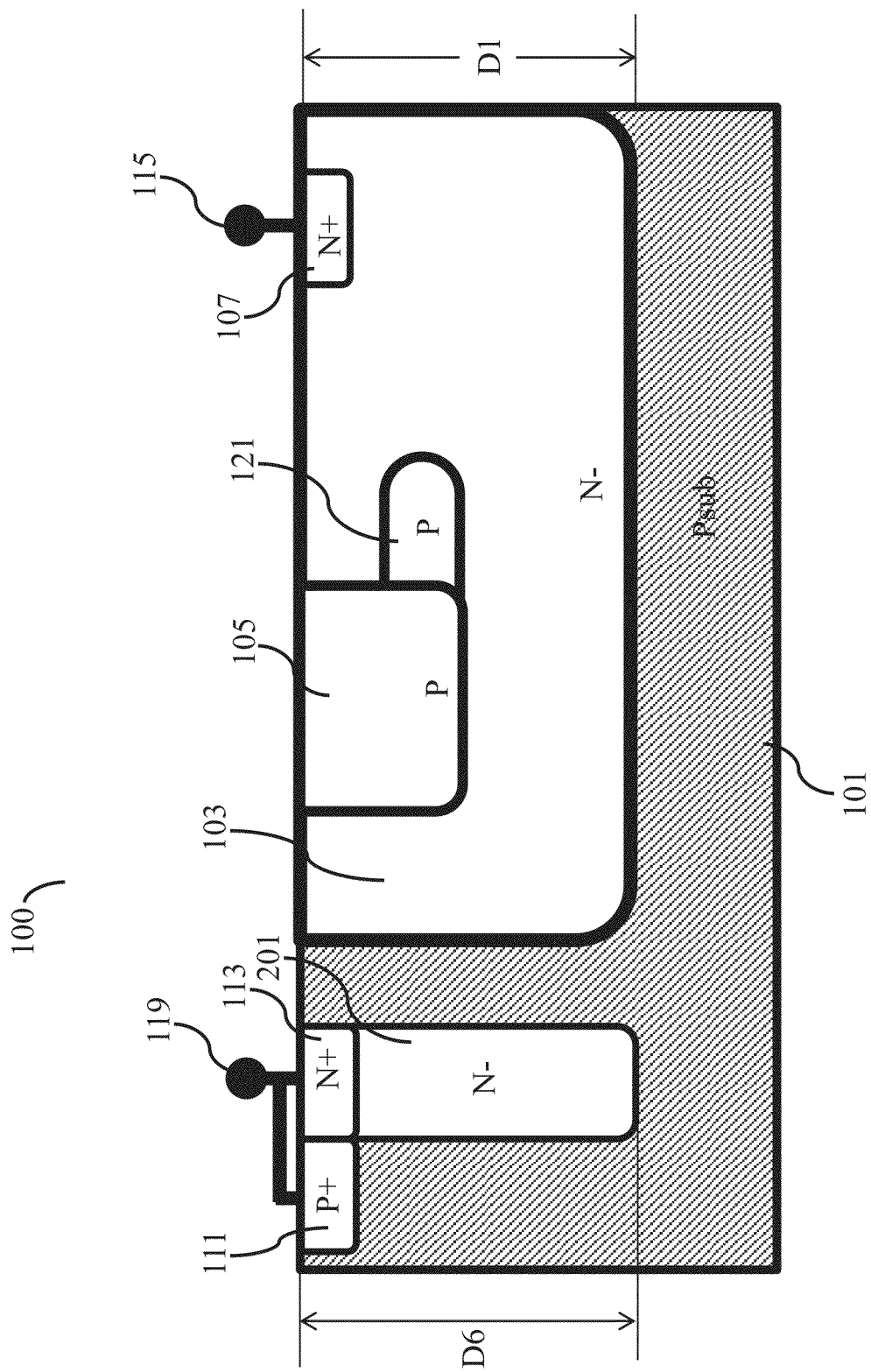
FIG. 3 is a diagram of the semiconductor device having an additional semiconductor region, in accordance with one or more embodiments.

FIG. 3 is a diagram of the semiconductor device 100 having an additional semiconductor region, in accordance with one or more embodiments.

In some embodiments, the semiconductor device 100 optionally comprises the sixth semiconductor region 201 below the fifth semiconductor region 113, in contact with the fifth semiconductor region 113, and to a sixth depth D6. In some embodiments, the sixth semiconductor region 201 has N-type conductivity. In some embodiments, the sixth semiconductor region 201 is an "N−" region. The sixth depth D6, in some embodiments, is equal to the first depth D1.

Figure 4:
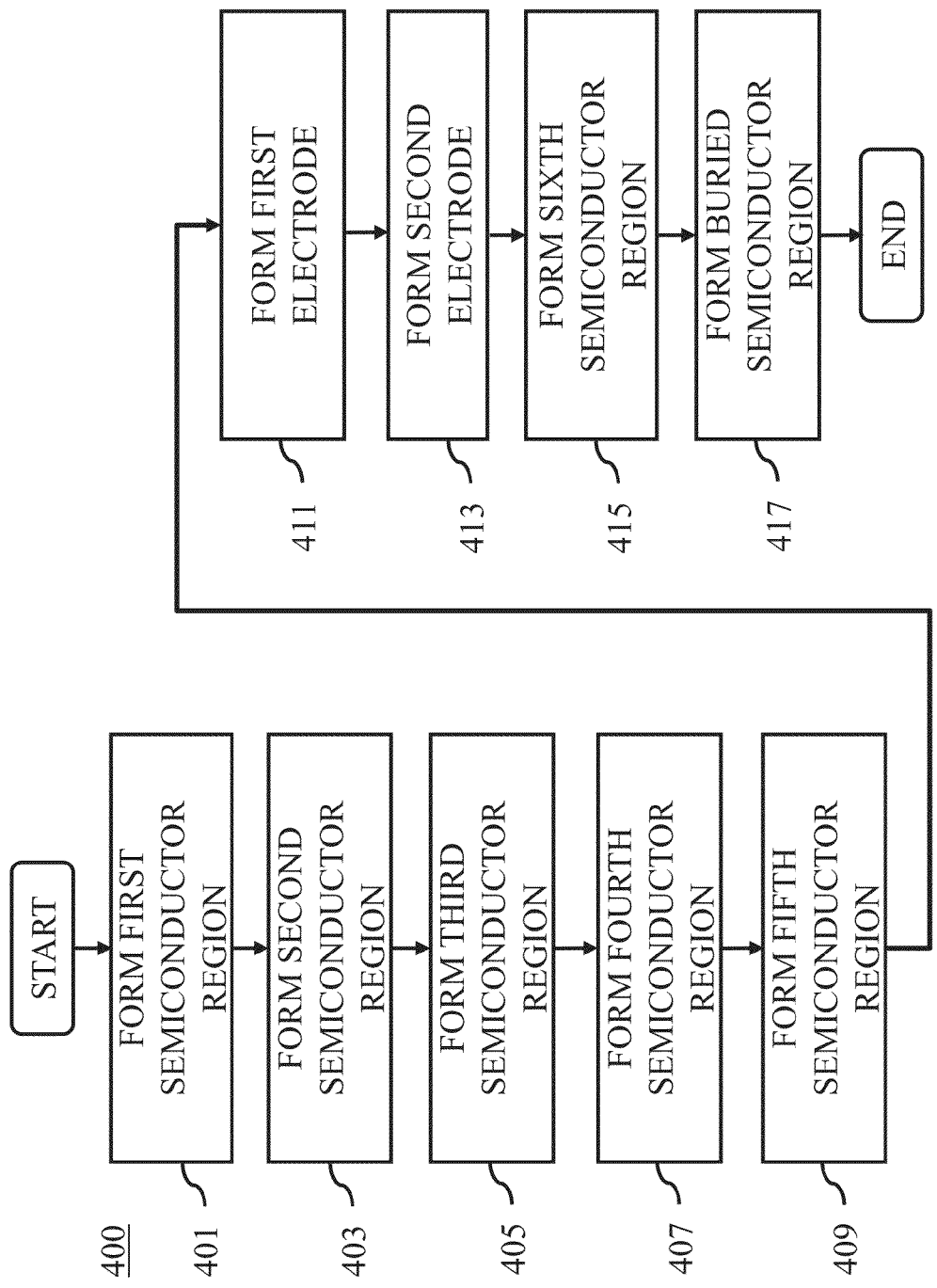
FIG. 4 is a flow chart of a method of forming a semiconductor device configured to improve current gain during a cathode to anode positive bias operation in an ultra high voltage application, in accordance with one or more embodiments.

FIG. 4 is a flow chart of a method 400 of forming a semiconductor device configured to make it possible to improve current gain during a cathode to anode positive bias operation in an ultra high voltage application, in accordance with one or more embodiments. Method 400 begins with step 401 in which a first semiconductor region is formed over a portion of a semiconductor substrate having a first conductivity type to a first depth relative to an upper surface of the semiconductor device. The first semiconductor region has a second conductivity type. In some embodiments, the first semiconductor region is formed by doping or implanting P-type dopants, such as boron, $BF_2$, or other suitable dopant, or N-type dopants, such as phosphorus, arsenic, or other suitable dopant; or a combination thereof.

In step 403, a second semiconductor region is formed in the first semiconductor region to a second depth less than the first depth relative to the upper surface. The second semiconductor region has the first conductivity type. In some embodiments, the second semiconductor region is formed by doping or implanting P-type dopants, such as boron, $BF_2$, or other suitable dopant, or N-type dopants, such as phosphorus, arsenic, or other suitable dopant; or a combination thereof.

In step 405, a third semiconductor region is formed in the first semiconductor region to a third depth less than the first depth relative to the upper surface. The third semiconductor region has the second conductivity type. In some embodiments, the third semiconductor region is formed by doping or implanting P-type dopants, such as boron, $BF_2$, or other suitable dopant, or N-type dopants, such as phosphorus, arsenic, or other suitable dopant; or a combination thereof.

In step 407, a fourth semiconductor region is formed outside the first semiconductor region to a fourth depth relative to the upper surface. The fourth semiconductor region has the first conductivity type. In some embodiments, the fourth semiconductor region is formed by doping or implanting P-type dopants, such as boron, $BF_2$, or other suitable dopant, or N-type dopants, such as phosphorus, arsenic, or other suitable dopant; or a combination thereof.

In step 409, a fifth semiconductor region is formed outside the first semiconductor region to a fifth depth relative to the upper surface. The fifth semiconductor region is adjacent the fourth semiconductor region and has the second conductivity type. In some embodiments, the fifth semiconductor region is formed by doping or implanting P-type dopants, such as boron, $BF_2$, or other suitable dopant, or N-type dopants, such as phosphorus, arsenic, or other suitable dopant; or a combination thereof.

In step 411, a first electrode is formed electrically connected to the third semiconductor region. In some embodiments, the first electrode is formed by a plating or implantation process, for example, or other suitable process for forming an electrode comprising a conductive material.

In step 413, a second electrode is formed electrically connected to the fourth semiconductor region and to the fifth semiconductor region. In some embodiments, the second electrode is formed by a plating or implantation process, for example, or other suitable process for forming an electrode comprising a conductive material. The fifth semiconductor region is configured make it possible to cause an increase in a current during a cathode to anode positive bias operation between the first electrode and the second electrode in ultra high voltage applications.

In step 415, a sixth semiconductor region is optionally formed below the fifth semiconductor region, in contact with the fifth semiconductor region, and to a sixth depth relative to the upper surface. The sixth semiconductor region has the second conductivity type. In some embodiments, the sixth semiconductor region is formed by doping or implanting P-type dopants, such as boron, $BF_2$, or other suitable dopant, or N-type dopants, such as phosphorus, arsenic, or other suitable dopant; or a combination thereof.

In step 417, a buried semiconductor region is optionally formed in the first semiconductor region adjacent the second semiconductor region. The buried semiconductor region has the first conductivity type. In some embodiments, the sixth semiconductor region is formed by doping or implanting P-type dopants, such as boron, $BF_2$, or other suitable dopant, or N-type dopants, such as phosphorus, arsenic, or other suitable dopant; or a combination thereof.

Figure 5:
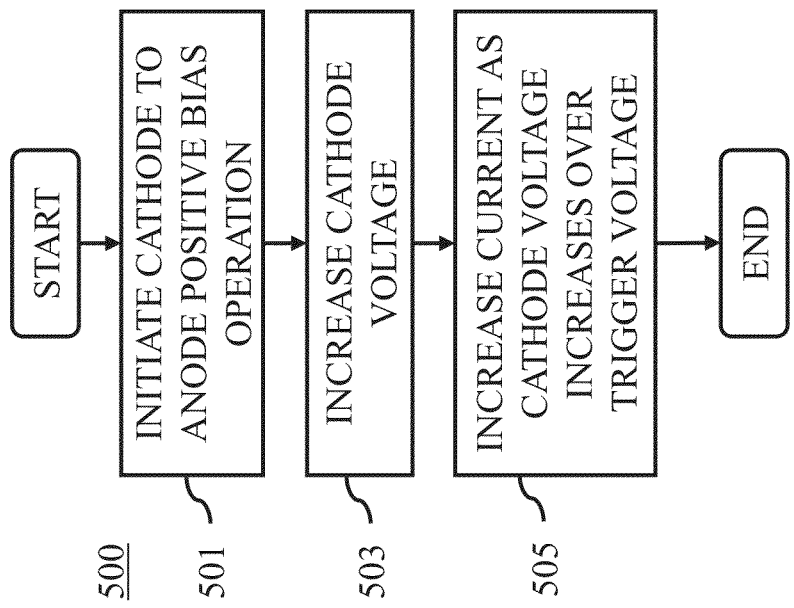
FIG. 5 is a flow chart of a method of performing a cathode to anode positive bias operation between two electrodes of a semiconductor device configured to make it possible to improve current gain during the cathode to anode positive bias operation in an ultra high voltage application, in accordance with one or more embodiments.

FIG. 5 is a flow chart of a method 500 of performing a cathode to anode positive bias operation between two electrodes of a semiconductor device configured to improve current gain during the cathode to anode positive bias operation in an ultra high voltage application, in accordance with one or more embodiments. Method 500 begins with step 501 in which a cathode to anode positive bias operation is initiated between a first electrode and a second electrode of a semiconductor device configured to improve current gain during the cathode to anode positive bias operation in ultra high voltage applications.

In step 503, a cathode voltage applied to the first electrode is increased.

In step 505, a current increases during the cathode to anode positive bias operation as the cathode voltage increases over a trigger voltage.

Figure 6:
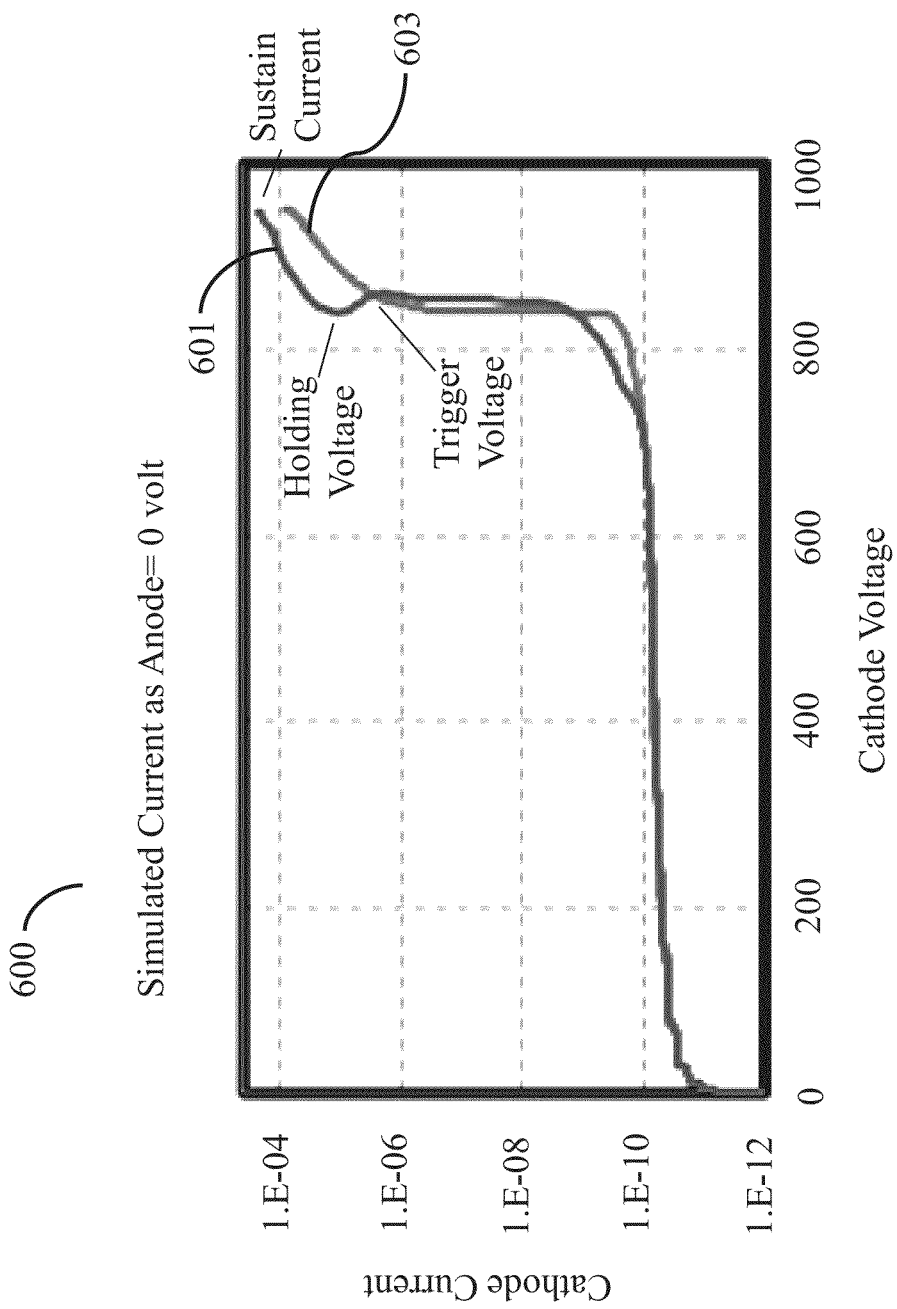
FIG. 6 is a chart illustrating simulation results indicating an increase in current during a cathode to anode positive bias operation in an ultra high voltage application, in accordance with one or more embodiments.

FIG. 6 is a chart 600 illustrating simulation results indicating an increase in current during a cathode to anode positive bias operation in an ultra high voltage application, in accordance with one or more embodiments. In this example simulation, the semiconductor device 100 was supplied a cathode voltage while the anode voltage was constrained at 0 V. As the cathode voltage increased, the cathode current increased as well. A first trend line 601 illustrates the behavior of the current in the semiconductor device 100 as the cathode voltage increased from 0 V to 1000 V. A second trend line 603 illustrates the behavior of the current in a common ESD Diode device as the cathode voltage increased from 0 V to 1000 V. The common ESD Diode device used in this simulation lacked the "N+" fifth semiconductor region 113 at the anode that is included in semiconductor device 100.

As the voltage supplied to the cathode increased to about 800 V, the behavior of the current in the semiconductor device 100 was similar to the current of the common ESD Diode device up to about 750 V. Then, at that point, the current in the semiconductor device 100 increased compared to the current in the common ESD Diode device as the voltage increased from about 750 V to about 850 V. Then, from about 850 V to about 875 V, the semiconductor device 100 and the common ESD Diode device again behaved similarly as the current increased at about the same rate.

However, once a trigger voltage of about 875 V was reached, the semiconductor device 100 and the common ESD Diode device behaved quite differently. At voltages above the trigger voltage, the current in the semiconductor device 100 increased an about greater than the amount the current increased in the common ESD Diode device, particularly while the voltage supplied was at a holding voltage. At the holding voltage, the current increased in the semiconductor device 100 significantly and from that point, the semiconductor device 100 sustained a current greater than the common ESD Diode device as the voltage supplied to the cathode increased to about 1000 V.

Figure 7:
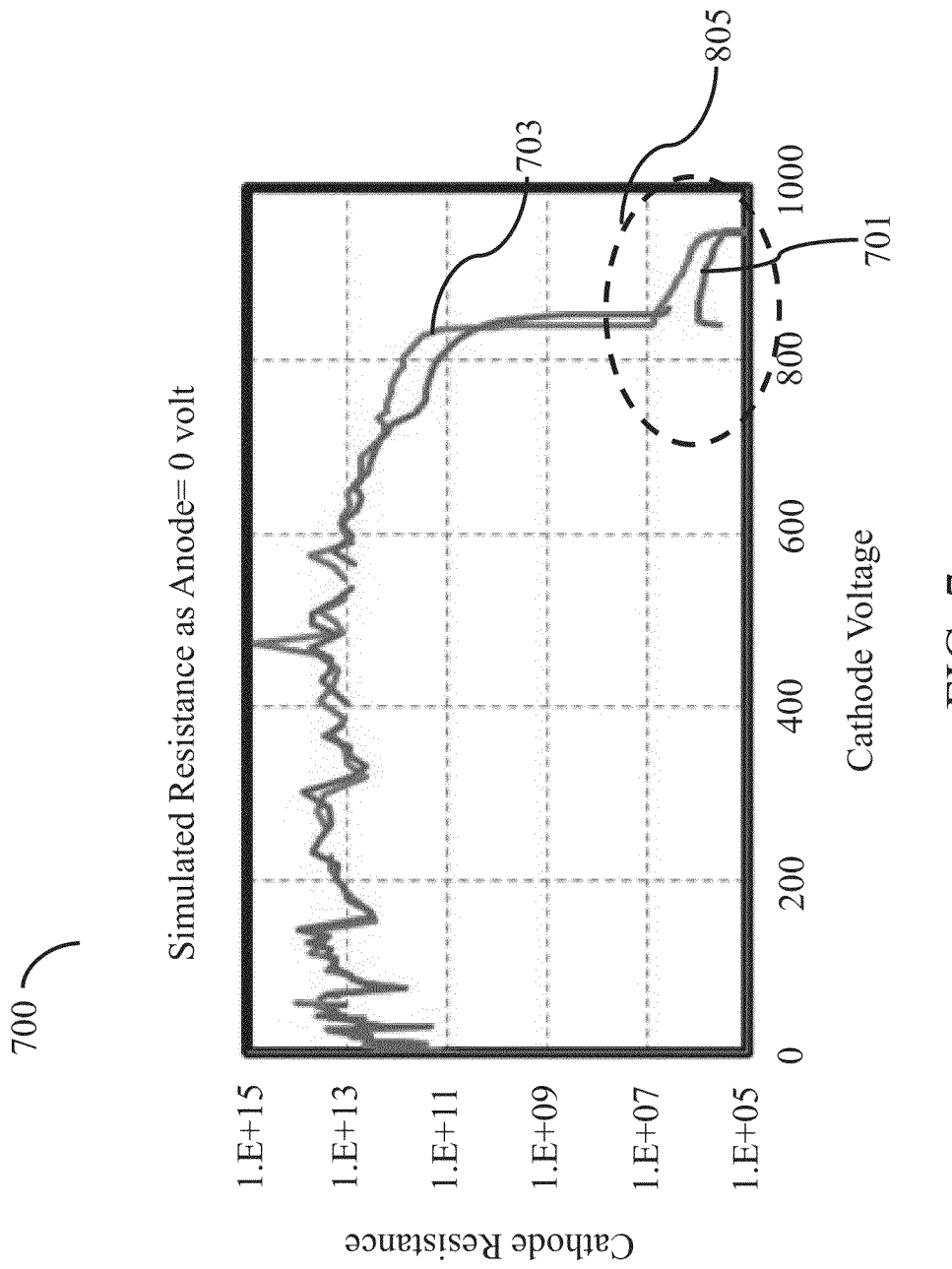
FIG. 7 is a chart illustrating simulation results indicating a negative resistance during a cathode to anode positive bias operation in an ultra high voltage application, in accordance with one or more embodiments.

FIG. 7 is a chart illustrating simulation results indicating a negative resistance during a cathode to anode positive bias operation in an ultra high voltage application, in accordance with one or more embodiments. In this example simulation, the semiconductor device 100 was supplied a cathode voltage while the anode voltage was constrained at 0 V. As the cathode voltage increased, the resistance trended generally proportionally with the increase in voltage supplied to the cathode and the increase in current. A first trend line 701 illustrates the behavior of the resistance of the semiconductor device 100 as the cathode voltage increased from 0 V to 1000V. A second trend line 703 illustrates the behavior of the resistance of a common ESD Diode device as the cathode voltage increased from 0 V to 1000 V. The common ESD Diode device used in this simulation lacked the "N+" fifth semiconductor region 113 at the anode that is included in semiconductor device 100.

As the voltage supplied to the cathode increased to about 800 V, the behavior of the resistance of the semiconductor device 100 was similar to the resistance of the common ESD Diode device up to about 750 V. Then, at that point, the resistance of the semiconductor device 100 decreased compared to the resistance of the common ESD Diode device as the voltage increased from about 750 V to about 850 V. Then, from about 850 V to about 875 V, the semiconductor device 100 and the common ESD Diode device again behaved similarly as the resistance decreased at about the same rate.

However, once a trigger voltage of about 875 V was reached, the semiconductor device 100 and the common ESD Diode device behaved quite differently. At voltages above the trigger voltage, the current in the semiconductor device 100 produced a negative resistance in the higher sustain current region 805 as the first trend line 701 decreased significantly compared to the common ESD Diode device, particularly while the voltage supplied was at the holding voltage and the voltage supplied to the cathode increased to about 1000 V.

One aspect of this description relates to a semiconductor device comprising a semiconductor substrate having a first conductivity type. The semiconductor device also comprises a first semiconductor region over a portion of the semiconductor substrate having the first conductivity type to a first depth relative to an upper surface, the first semiconductor region having a second conductivity type. The semiconductor device further comprises a second semiconductor region in the first semiconductor region to a second depth less than the first depth relative to the upper surface, the second semiconductor region having the first conductivity type. The semiconductor device additionally comprises a third semiconductor region in the first semiconductor region to a third depth less than the first depth relative to the upper surface, the third semiconductor region having the second conductivity type. The semiconductor device also comprises a fourth semiconductor region outside the first semiconductor region to a fourth depth relative to the upper surface, the fourth semiconductor region having the first conductivity type. The semiconductor device further comprises a fifth semiconductor region outside the first semiconductor region to a fifth depth relative to the upper surface, the fifth semiconductor region being adjacent the fourth semiconductor region and having the second conductivity type. The semiconductor device additionally comprises a first electrode electrically connected to the third semiconductor region. The semiconductor device also comprises a second electrode electrically connected to the fourth semiconductor region and to the fifth semiconductor region. The fifth semiconductor region is configured to cause an increase in a current during a cathode to anode positive bias operation between the first electrode and the second electrode.

Another aspect of this description relates to a method comprising a first semiconductor region over a portion of a semiconductor substrate having a first conductivity type to a first depth relative to an upper surface, the first semiconductor region having a second conductivity type. The method also comprises forming a second semiconductor region in the first semiconductor region to a second depth less than the first depth relative to the upper surface, the second semiconductor region having the first conductivity type. The method further comprises forming a third semiconductor region in the first semiconductor region to a third depth less than the first depth relative to the upper surface, the third semiconductor region having the second conductivity type. The method additionally comprises forming a fourth semiconductor region outside the first semiconductor region to a fourth depth relative to the upper surface, the fourth semiconductor region having the first conductivity type. The method also comprises forming a fifth semiconductor region outside the first semiconductor region to a fifth depth relative to the upper surface, the fifth semiconductor region being adjacent the fourth semiconductor region and having the second conductivity type. The method further comprises forming a first electrode electrically connected to the third semiconductor region. The method additionally comprises forming a second electrode electrically connected to the fourth semiconductor region and to the fifth semiconductor region. The fifth semiconductor region is configured to cause an increase in a current during a cathode to anode positive bias operation between the first electrode and the second electrode.

Still another aspect of this description relates to method comprising initiating a cathode to anode positive bias operation between a first electrode and a second electrode of a semiconductor device. The semiconductor device comprises a semiconductor substrate having a first conductivity type. The semiconductor device also comprises a first semiconductor region over a portion of the semiconductor substrate having the first conductivity type to a first depth relative to an upper surface, the first semiconductor region having a second conductivity type. The semiconductor device further comprises a second semiconductor region in the first semiconductor region to a second depth less than the first depth relative to the upper surface, the second semiconductor region having the first conductivity type. The semiconductor device additionally comprises a third semiconductor region in the first semiconductor region to a third depth less than the first depth relative to the upper surface, the third semiconductor region having the second conductivity type. The semiconductor device also comprises a fourth semiconductor region outside the first semiconductor region to a fourth depth relative to the upper surface, the fourth semiconductor region having the first conductivity type. The semiconductor device further comprises a fifth semiconductor region outside the first semiconductor region to a fifth depth relative to the upper surface, the fifth semiconductor region being adjacent the fourth semiconductor region and having the second conductivity type. The semiconductor device additionally comprises the first electrode electrically connected to the third semiconductor region. The semiconductor device also comprises the second electrode electrically connected to the fourth semiconductor region and to the fifth semiconductor region. The method also comprises increasing a cathode voltage applied to the first electrode. The method further comprises increasing a current during the cathode to anode positive bias operation as the cathode voltage increases over a trigger voltage. The increase in the current is caused by the fifth semiconductor region.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A semiconductor device comprising:
   a semiconductor substrate having a first conductivity type;
   a first semiconductor region over a portion of the semiconductor substrate having the first conductivity type to a first depth relative to an upper surface of the semiconductor substrate, the first semiconductor region having a second conductivity type;
   a second semiconductor region in the first semiconductor region to a second depth less than the first depth relative to the upper surface, the second semiconductor region having the first conductivity type;
   a buried semiconductor region in the first semiconductor region adjacent the second semiconductor region, the buried semiconductor region having the first conductivity type;
   a third semiconductor region in the first semiconductor region to a third depth less than the first depth relative to the upper surface, the third semiconductor region having the second conductivity type;
   a fourth semiconductor region outside the first semiconductor region to a fourth depth relative to the upper surface, the fourth semiconductor region having the first conductivity type;
   a fifth semiconductor region outside the first semiconductor region to a fifth depth relative to the upper surface, the fifth semiconductor region being adjacent the fourth semiconductor region and having the second conductivity type;
   a first electrode electrically connected to the third semiconductor region; and
   a second electrode electrically connected to the fourth semiconductor region and to the fifth semiconductor region,
   wherein the fifth semiconductor region is configured to cause an increase in a current during a cathode to anode positive bias operation between the first electrode and the second electrode.

2. The semiconductor device of claim 1, wherein the first conductivity type is P-type and the second conductivity type is N-type.

3. The semiconductor device of claim 2, wherein the fifth region is an N+ region and the fourth region is a P+ region.

4. The semiconductor device of claim 3, further comprising:
   a sixth semiconductor region below the fifth semiconductor region, in contact with the fifth semiconductor region, and to a sixth depth relative to the upper surface, the sixth semiconductor region having the second conductivity type.

5. The semiconductor device of claim 4, wherein the sixth depth is greater than the fifth depth and less than the first depth.

6. The semiconductor device of claim 4, wherein the sixth semiconductor region is an N region and the first semiconductor region is an N− region.

7. The semiconductor device of claim 1, wherein the fifth depth is equal to the fourth depth.

8. The semiconductor device of claim 1, wherein the fifth depth is greater than the fourth depth.

9. The semiconductor device of claim 1, wherein the first semiconductor region extends continuously from the upper surface of the substrate to the first depth, the second semiconductor region extends continuously from the upper surface of the substrate to the second depth, the third semiconductor region extends continuously from the upper surface of the substrate to the third depth, the fourth semiconductor region extends continuously from the upper surface of the substrate to the fourth depth, and the fifth semiconductor region extends continuously from the upper surface of the substrate to the fifth depth.

10. A method comprising:
forming a first semiconductor region over a portion of a semiconductor substrate having a first conductivity type to a first depth relative to an upper surface of the semiconductor substrate, the first semiconductor region having a second conductivity type;
forming a second semiconductor region in the first semiconductor region to a second depth less than the first depth relative to the upper surface, the second semiconductor region having the first conductivity type;
forming a third semiconductor region in the first semiconductor region to a third depth less than the first depth relative to the upper surface, the third semiconductor region having the second conductivity type;
forming a fourth semiconductor region outside the first semiconductor region to a fourth depth relative to the upper surface, the fourth semiconductor region having the first conductivity type;
forming a fifth semiconductor region outside the first semiconductor region to a fifth depth relative to the upper surface, the fifth semiconductor region being adjacent the fourth semiconductor region and having the second conductivity type;
forming a sixth semiconductor region below the fifth semiconductor region, in contact with the fifth semiconductor region, and to a sixth depth relative to the upper surface;
forming a first electrode electrically connected to the third semiconductor region; and
forming a second electrode electrically connected to the fourth semiconductor region and to the fifth semiconductor region,
wherein the fifth semiconductor region is configured to cause an increase in a current during a cathode to anode positive bias operation between the first electrode and the second electrode.

11. The method of claim 10, wherein the first conductivity type is P− type and the second conductivity type is N-type.

12. The method of claim 11, wherein the fifth region is an N+ region and the fourth region is a P+ region.

13. The method of claim 12, wherein the sixth semiconductor region has the second conductivity type.

14. The method of claim 10, wherein the sixth depth is greater than the fifth depth and less than the first depth.

15. The method of claim 10, wherein the fifth depth is greater than or equal to the fourth depth.

16. The method of claim 10, further comprising:
forming a buried semiconductor region in the first semiconductor region adjacent the second semiconductor region, the buried semiconductor region having the first conductivity type.

17. A method comprising:
initiating a cathode to anode positive bias operation between a first electrode and a second electrode of a semiconductor device, the semiconductor device comprising
a semiconductor substrate having a first conductivity type;
a first semiconductor region over a portion of the semiconductor substrate having the first conductivity type to a first depth relative to an upper surface of the semiconductor substrate, the first semiconductor region having a second conductivity type;
a second semiconductor region in the first semiconductor region to a second depth less than the first depth relative to the upper surface of the semiconductor substrate, the second semiconductor region having the first conductivity type;
a third semiconductor region in the first semiconductor region to a third depth less than the first depth relative to the upper surface of the semiconductor substrate, the third semiconductor region having the second conductivity type;
a fourth semiconductor region outside the first semiconductor region to a fourth depth relative to the upper surface of the semiconductor substrate, the fourth semiconductor region having the first conductivity type;
a fifth semiconductor region outside the first semiconductor region to a fifth depth relative to the upper surface of the semiconductor substrate, the fifth semiconductor region being adjacent the fourth semiconductor region and having the second conductivity type;
the first electrode electrically connected to the third semiconductor region; and
the second electrode electrically connected to the fourth semiconductor region and to the fifth semiconductor region;
increasing a cathode voltage applied to the first electrode; and
increasing a current during the cathode to anode positive bias operation as the cathode voltage increases over a trigger voltage,
wherein the increase in the current is caused by the fifth semiconductor region.

18. The method of claim 17, wherein the fifth depth is greater than the fourth depth.

19. The semiconductor device of claim 17, wherein the semiconductor device further comprises a buried semiconductor region in the first semiconductor region adjacent the second semiconductor region, the buried semiconductor region having the first conductivity type.

20. The method of claim 17, wherein the first conductivity type is P-type and the second conductivity type is N-type.

* * * * *